United States Patent
Grodzki et al.

(10) Patent No.: US 10,317,487 B2
(45) Date of Patent: Jun. 11, 2019

(54) METHOD AND MAGNETIC RESONANCE APPARATUS FOR ACQUISITION OF MR DATA OF A TWO-DIMENSIONAL VOLUME SEGMENT

(71) Applicant: Siemens Aktiengesellschaft, Munich (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 1148 days.

(21) Appl. No.: 14/627,184

(22) Filed: Feb. 20, 2015

(65) Prior Publication Data
US 2015/0234024 A1  Aug. 20, 2015

(30) Foreign Application Priority Data
Feb. 20, 2014  (DE) .................. 10 2014 203 068

(51) Int. Cl.
*G01R 33/34* (2006.01)
*G01R 33/48* (2006.01)
*G01R 33/561* (2006.01)

(52) U.S. Cl.
CPC ......... *G01R 33/4824* (2013.01); *G01R 33/34* (2013.01); *G01R 33/482* (2013.01); *G01R 33/5611* (2013.01)

(58) Field of Classification Search
CPC .. G01R 33/4824; G01R 33/34; G01R 33/482; G01R 33/5611

(Continued)

(56) References Cited

U.S. PATENT DOCUMENTS 6,424,153 B1 * 7/2002 Liu ................... G01R 33/56509
                                                      324/307
8,207,734 B2   6/2012 Takahashi et al.
(Continued)

FOREIGN PATENT DOCUMENTS

CN            102389309 A       3/2012

OTHER PUBLICATIONS

Hollingsworth, Kieren, Reducing acquisition time in clinical MRI by data undersampling and compressed sensing reconstruction. Newcastle Magnetic Resonance Center, Institute of Cellular Medicine, Newcastle University, Oct. 8, 2015.*

(Continued)

*Primary Examiner* — Patrick Assouad
*Assistant Examiner* — Sean Curtis
(74) *Attorney, Agent, or Firm* — Schiff Hardin LLP

(57) ABSTRACT

In a method for the acquisition of magnetic resonance (MR) data relating to a pre-determined two-dimensional volume segment of an examination object with an MR apparatus, a randomized determination of points to be sampled in the raw data space is made, such that the raw data space is undersampled when only the determined points to be sampled are then sampled. MR data relating to the specified points to be sampled are acquired by operation of the MR apparatus. Alternatively, a determination of points to be sampled in the raw data space is made using radial or spiral trajectories in k-space that begin in the center k-space. Each specified point to be sampled is then moved to an FFT grid point, and MR data relating to the determined points to be sampled is implemented by operation of the MR apparatus.

14 Claims, 7 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 8,848,993 | B2* | 9/2014 | Zenge | G01R 33/4822 |
| | | | | 382/128 |
| 9,146,291 | B2 | 9/2015 | Speier | |
| 9,274,195 | B2* | 3/2016 | Pfeuffer | G01R 33/4833 |
| 9,339,239 | B2* | 5/2016 | Wang | A61B 5/7221 |
| 9,360,544 | B2* | 6/2016 | Huang | G01R 33/4804 |
| 9,465,091 | B2* | 10/2016 | Riederer | G01R 33/4822 |
| 9,482,732 | B2* | 11/2016 | Chesneau | G01R 33/4824 |
| 9,983,285 | B2* | 5/2018 | Hu | G01R 33/5601 |
| 9,989,611 | B2* | 6/2018 | Zhao | G01R 33/4824 |
| 10,101,424 | B2* | 10/2018 | Levine | G01R 33/4835 |
| 2002/0014889 | A1 | 2/2002 | Prussmann et al. | |
| 2007/0009080 | A1 | 1/2007 | Mistretta | |
| 2007/0038073 | A1 | 2/2007 | Mistretta | |
| 2007/0055134 | A1* | 3/2007 | Fuderer | G01R 33/5611 |
| | | | | 600/410 |
| 2008/0021303 | A1* | 1/2008 | Krueger | G01R 33/5615 |
| | | | | 600/410 |
| 2009/0238430 | A1* | 9/2009 | Haider | G01R 33/482 |
| | | | | 382/131 |
| 2009/0278539 | A1* | 11/2009 | Beatty | A61B 5/055 |
| | | | | 324/312 |
| 2010/0201363 | A1* | 8/2010 | Griswold | G01R 33/4824 |
| | | | | 324/314 |
| 2011/0080166 | A1* | 4/2011 | Edelman | G01R 33/5607 |
| | | | | 324/309 |
| 2011/0095762 | A1* | 4/2011 | Piccini | G01R 33/4824 |
| | | | | 324/312 |
| 2013/0265052 | A1* | 10/2013 | Nickel | G01R 33/5611 |
| | | | | 324/309 |
| 2014/0266193 | A1* | 9/2014 | Kecskemeti | G01R 33/5602 |
| | | | | 324/309 |
| 2015/0234024 | A1* | 8/2015 | Grodzki | G01R 33/34 |
| | | | | 324/309 |
| 2015/0316630 | A1* | 11/2015 | Zhao | G01R 33/4824 |
| | | | | 324/309 |
| 2015/0346305 | A1* | 12/2015 | King | G01R 33/5611 |
| | | | | 324/309 |
| 2016/0054418 | A1* | 2/2016 | Doneva | G01R 33/5611 |
| | | | | 324/309 |

OTHER PUBLICATIONS

Vidya G. et al., Undersampling Pattern for Compressive Sampling MRI, International Conference on Signal, Image Processing Communication and Automation—ICSIPCA—2017 (Year: 2017).*

Wang et al., "Smoothed Random-Like Trajectory for Compressed Sensing MRI," 34th Annual International Conference of the IEEE EMBS, San Diego, California USA, Aug. 28-Sep. 1, 2012, pp. 404-407 (2012).

Cheng et al., "Variable-Density Radial View-Ordering and Sampling for Time-Optimized 3D Cartesian Imaging," ISMRM Workshop on Data Sampling & Image Reconstruction, 2013, one page.

Henning, J., "Limits of Spatial Encoding," Follensatz, Uniklinikum Freiburg (2013).

Lustig, M., "A Fast Method for Designing Time-Optimal Gradient Waveforms for Arbitrary k-Space Trajectories," IEEE Trans Med Imaging, vol. 27(6) (2008), pp. 866-873.

El-Metwally et al., "Rapid Cardiac MRI Using Random Radial Trajectories," Journal of Engineering and Applied Science, vol. 55, No. 5 (2008), pp. 441-456.

Lustig. et al. Lustig M. et al; "Faster Imaging with Randomly Perturbed, Undersampled Spirals and /L/_1 reconstruction"; Electrical Engineering, Stanford University, Proc.Int. Soc. Mag. Reson. Med., 13, pp. 685; (2005).

* cited by examiner

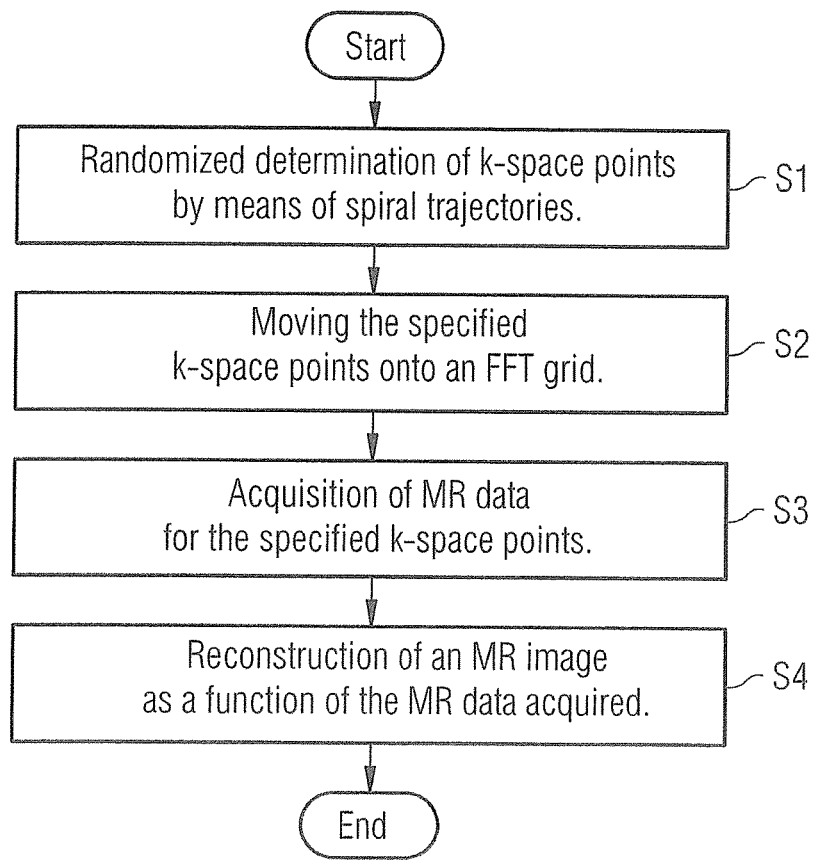

METHOD AND MAGNETIC RESONANCE APPARATUS FOR ACQUISITION OF MR DATA OF A TWO-DIMENSIONAL VOLUME SEGMENT

BACKGROUND OF THE INVENTION

Field of the Invention

The present invention relates to a method for determining points in the raw data space (that is, k-space points) and for acquiring magnetic resonance (MR) data relating to these points, and to a magnetic resonance apparatus designed to implement such a method.

Description of the Prior Art

Accelerating patient examination is a central issue in clinical MR imaging. The acquisition time not only has a significant influence on the throughput of the respective magnetic resonance unit, but furthermore determines how long the individual patient will have to be in the magnetic resonance unit.

While increases in speed have been achieved recently with regard to the acquisition time when acquiring three-dimensional volume segments, no comparable increased speeds exist with regard to the acquisition time when capturing two-dimensional volume segments or slices. While known methods offer faster speeds for three-dimensional MR sequences, there are no corresponding measures in existence to accelerate conventional static two-dimensional MR cross-section imaging, which accounts for an estimated 90% of all MR images generated.

SUMMARY OF THE INVENTION

An object of the present invention is to accelerate the acquisition of MR data relating to a two-dimensional volume segment.

The present invention provides a method for the acquisition of MR data from a pre-determined two-dimensional volume segment or from a pre-determined slice within an examination object by operation of a magnetic resonance apparatus, that includes randomized determination of k-space points to be sampled, wherein the k-space that corresponds to the two-dimensional volume segment or to the slice is undersampled, when only the specified k-space points to be sampled are then sampled, acquisition of the MR data relating to the k-space points to be sampled, which were determined by the aforementioned randomized determination, with the magnetic resonance apparatus.

Optionally a further step can be added, in which, for example, an MR image is reconstructed as a function of the MR data acquired.

Since two-dimensional k-space is undersampled, considerably fewer k-space points are sampled in comparison with a known method in which k-space is sampled in its entirety, as a result of which the sampling or acquisition of the MR data can advantageously be accelerated accordingly. Simulations and investigations show that the MR data acquired in this manner results in the reconstruction of an MR image of the volume segment without artifacts, insofar as the missing (not sampled) k-space points have a random distribution. In other words, when the sampled k-space points have a random distribution, the MR data relating to the sampled k-space points contain the corresponding image data despite the undersampling. This applies even to high undersampling rates R of 2 to 2.5, for example, where the sampled k-space points only encompass 50% to 40% of the potential data points or k-space points actually located in k-space. Studies have shown that despite these undersampling rates, it is possible to achieve a clinically identical image quality (compared with MR images that have been reconstructed from MR data sampled in their entirety).

If each k-space point in polar coordinates is defined by an angle that is enclosed by a straight line that is defined by the center of k-space and the respective k-space point, and by an axis running through the center of k-space, and a distance from the center of k-space is defined, the randomized determination of the k-space points to be sampled presupposes both a constant density of k-space points to be sampled as a function of the angle, and a density of the k-space points to be sampled that decreases with the distance from the center of k-space.

In other words, the k-space points to be sampled are determined such that the density of k-space points in polar coordinates constantly decreases on average as a function of the angle and as a function of the distance between them on average, the greater that distance is. Thus the probability that a specified k-space point is one of the quantity of k-space points to be sampled, is greater, the smaller the distance of this k-space point from the center of k-space. Moreover, the probability, for k-space points, that are the same distance away from the center of k-space but that have different angles, of being among the quantity of k-space points to be sampled is the same, since the probability that the respective k-space point will be among the k-space points to be sampled is advantageously independent of the respective angle.

If according to the invention, there is an essentially regular pseudo-random distribution of the k-space points in the direction of the arc, while radially a prescribed pseudo-random distribution that decreases with the distance from the center of k-space is sought (for example, a distribution that decreases by the factor $1/r^x$, where r is the distance and x a value between 1 and 3), simulations and studies show a very good and robust two-dimensional sampling, without any artifacts occurring in the reconstructed MR image even at high sub-sampling rates. The main requirement for a random distribution of the missing (not sampled) k-space points is accordingly met by the aforementioned pseudo-random distribution of the k-space points to be sampled.

According to a preferred embodiment of the invention, the randomized determination of the k-space points to be sampled is carried out along radial or spiral trajectories that begin in the center of k-space, and the k-space points to be sampled are determined with respect to such trajectories.

For example, it is possible, taking into account the aforementioned random distribution, for the k-space points to be sampled to be arranged on the radial or spiral trajectories.

An important property of spiral trajectories is the pitch, which determines the distance between two adjacent revolutions of the respective spiral or trajectory. Where the pitch is infinite in length, the spiral trajectory degenerates into the radial trajectory. In genuine spiral trajectories, the pitch selected should not be too high. For example, the pitch can be selected such that the respective spiral or trajectory already impinges on the edge of the K-space after one revolution.

According to a preferred embodiment of the invention, in a first step intermediate points on the trajectories are determined for the randomized determination of the k-space points to be sampled, starting from radial or spiral trajectories. If each of these intermediate points is defined by polar coordinates with regard to the center of k-space, then the angle $\varphi_{KP}$ of a k-space point to be sampled can be determined using the following equation (1), starting from the angle $\varphi_{ZP}$ of the respective intermediate point.

$$\varphi_{KP}=\varphi_{ZP}+ZW \qquad (1)$$

Here ZW corresponds to a random angle that is assigned to the angle of the intermediate point. The distance from the center of k-space does not change, with the result that this distance for the k-space point to be sampled corresponds to the distance for the corresponding intermediate point.

According to this embodiment, the pre-determined distribution density of k-space points to be sampled can be maintained since the intermediate points corresponding to said distribution density are placed on the trajectories. The k-space points to be sampled are moved abruptly starting from the intermediate points, as a function of the size of the random angle ZW in the $\varphi$ direction. If the random angles have a mean value of 0° then the k-space points to be sampled that have been determined in such a manner will have (on average) the pre-determined distribution density.

Studies have shown that k-space points to be sampled that are located on a spiral (that is, are not moved to face this spiral), have a worse distribution than k-space points to be sampled that are moved randomly to face this spiral.

According to the invention, there are two different variants. According to a first variant, the same k-space point can be determined multiple times as a k-space point to be sampled and therefore sampled. According to a second variant, the same k-space point cannot be determined multiple times, with the result that each k-space point is only sampled a maximum of once.

It is precisely in k-space regions in the vicinity of the center of k-space that, in principle, more k-space points can be sampled using the first variant (multiple sampling of the same k-space point) than with the second variant. As a result, the signal-noise ratio can be increased advantageously.

According to a further embodiment as per the invention, the k-space points to be sampled are arranged into a specific sequence before the acquisition of the MR data. This sequence is selected such that a distance between two k-space points to be sampled that are consecutive according to this sequence is as short as possible.

Because of the fact that the previously specified k-space points to be sampled have been arranged into an optimized sequence before the MR data for these k-space points in the optimized sequence have been acquired, the change in the magnetic field gradient can advantageously be kept as small as possible during the acquisition of the MR data. As a result, it is advantageously possible to avoid an abrupt change in the magnetic field gradient, which leads to the development of severe noise.

In MR imaging, the term trajectory is generally understood to mean a line along which the k-space points to be acquired are located. Herein, the term trajectory is also understood to mean a type of starting line, starting from which the k-space points to be sampled are determined. Once the k-space points to be sampled have been determined, then those trajectories by means of which the MR data relating to the k-space points to be sampled are acquired can be determined. It is then also possible for an optimized sequence of the k-space points to be sampled to be taken into account.

Advantageously, the acquisition of the MR data with a plurality of receiving antennas can be carried out with the aid of a parallel acquisition technique.

According to said acquisition technique, also known as iPAT$^2$ ("integrated Parallel Acquisition Technique") 64 ($8^2$) receiving antennas, for example, are used in parallel or simultaneously, in order to acquire the MR data simultaneously in both k-space directions.

According to a further embodiment of the invention, the specified k-space points to be sampled before the acquisition of the MR data are moved onto a grid point on a pre-determined FFT grid. The FFT grid in k-space is defined by parallel first straight lines and parallel second straight lines, each of the first straight lines being perpendicular to each of the second straight lines. Two respective adjacent lines from the first straight lines have the same distance between them as two respective adjacent lines from the second straight lines. Each grid point corresponds to the point of intersection between one line from the first straight lines and one line from the second straight lines.

In other words, the k-space points to be sampled are discretized onto the FFT grid. This step of moving the k-space points to be sampled onto the FFT grid is carried out before any optimization of the sequence in which the k-space points to be sampled are ultimately sampled. In this embodiment, the courses of the gradients (in the acquisition of the MR data) increase dramatically from time-step to time-step (from k-space point to k-space point) by a whole-number multiple of a quantized basic step (distance between two adjacent first or second straight lines). Experiments have shown that the increment necessary in this embodiment is, however, well below what is known as the slew rate limit of present-day magnetic resonance units.

A significant advantage of this embodiment is that no "gridding" is necessary. Gridding involves the interpolation of the acquired MR data onto a periodic grid, which has the disadvantage of requiring a considerable amount of computation time. Furthermore, the interpolation required tends to be a source of numerical error, precisely in regions with a low density of k-space points to be sampled.

Advantageously, a simple inverse Fourier transform can be used in the reconstruction. An iterative reconstruction is not necessary but can be used to improve the image quality.

The present invention also encompasses a method for the acquisition of MR data from a pre-determined two-dimensional volume segment of an examination object by the operation of a magnetic resonance apparatus, wherein the k-space points to be sampled are determined with the use of radial or spiral trajectories that begin in the center of k-space. The k-space points to be sampled can be located on these trajectories or can be determined with the use of these trajectories, as described above. Each specified k-space point to be sampled is moved to a grid point on a pre-determined FFT grid. MR data relating to the k-space points to be sampled that have been determined and moved onto the FFT grid are then acquired.

The advantages of the this embodiment of the method according to the invention correspond to the advantages of the embodiment of the method according to the invention that was described initially, in which embodiment the k-space points to be sampled are likewise moved onto FFT grid points. In other words, the moving of the k-space points to be sampled onto FFT grid points is independent of the random distribution of the k-space points to be sampled.

The present invention also encompasses a magnetic resonance apparatus for the acquisition of MR data relating to a pre-determined volume segment within an examination object. The magnetic resonance apparatus has a basic field magnet, a gradient field system, one or multiple RF antennas, a control computer to control the gradient field system and the at least one RF antenna to receive the test signals recorded by the at least one RF antenna and to evaluate these test signals, and a computational computer. The computational computer is designed to determine randomized k-space points to be sampled so that k-space is undersampled when only the specified k-space points to be sampled are then sampled. Furthermore, the magnetic resonance apparatus has a sequence controller, that operates the aforementioned components of the magnetic resonance apparatus in order to acquire the MR data relating to the specified k-space points to be sampled.

The advantages of this magnetic resonance apparatus according to the invention essentially correspond to the advantages of the method according to the invention described initially.

The present invention also encompasses a magnetic resonance apparatus for the acquisition of MR data relating to a pre-determined volume segment within an examination object, that also has a basic field magnet, a gradient field system, one or multiple RF antennas, a control computer to control the gradient field system and the at least one RF antenna to receive the test signals captured by the at least one RF antenna and to evaluate these test signals, and a computational computer. The computational computer is designed to determine k-space points to be sampled with the use of radial or spiral trajectories that begin in the center of k-space. The computational computer also is designed to move each of these specific k-space points to be sampled onto an FFT grid point. The magnetic resonance apparatus further has a sequence controller that operates the aforementioned components in order to acquire the MR data relating to the specified k-space points to be sampled.

The advantages of the further magnetic resonance unit according to the invention essentially correspond to the advantages of the further method according to the invention, which have been set out in detail in the aforementioned so that repetition thereof is dispensed with here.

The present invention further includes a non-transitory, computer-readable data storage medium encoded with instructions or commands, in particular a computer program or software, that can be loaded directly into a memory of a programmable control computer or computational computer of a magnetic resonance apparatus. The instructions or commands cause all or various embodiments of the methods according to the invention that have been described above to be implemented by the aforementioned computers. The storage medium may require programming means, for example, libraries and auxiliary functions, in order to carry out the corresponding embodiments of the methods. The instructions or commands can be a source code (for example C++) which still has to be compiled (translated) and linked or which only has to be interpreted, or can be an executable software code that only needs to be loaded into the corresponding computer in order to be executed.

The electronically readable data carrier can be, for example, a DVD, a magnetic tape or a USB stick, on which electronically readable control data, in particular software (see above), are stored.

The present invention is suited for undersampling of a two-dimensional volume segment in the context of ("Compressed Sensing"), for example, in order to acquire MR data using a gradient echo method, for example. In addition to the acquisition of high-quality MR images, the present invention facilitates the rapid generation of whole-body images. The present invention is not restricted to the sampling of two-dimensional volume segments, since at least the further embodiments of the method according to the invention and the magnetic resonance apparatus according to the invention can be used for the acquisition of MR data relating to a three-dimensional volume segment.

BRIEF DESCRIPTION OF THE DRAWINGS

FIG. 9 is a flowchart of a method according to the invention.

DESCRIPTION OF THE PREFERRED EMBODIMENTS

Figure 1:
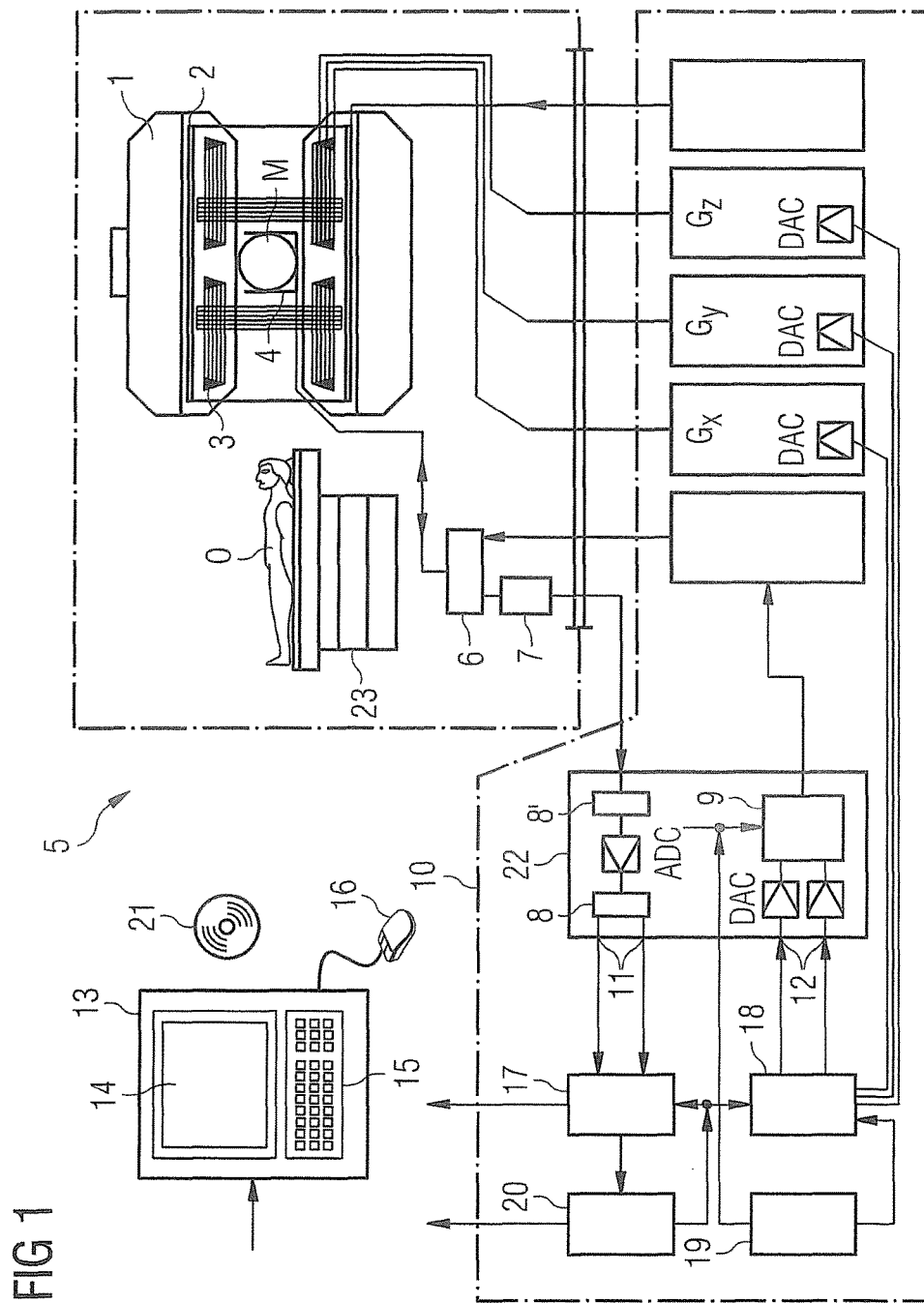
FIG. 1 schematically illustrates a magnetic resonance apparatus according to the invention.

FIG. 1 shows in block diagram form a magnetic resonance unit 5 (a magnetic resonance imaging or nuclear magnetic resonance tomography device). A basic field magnet 1 generates a chronologically constant strong magnetic field for the polarization or alignment of the nuclear spins in an investigation region of an object O, such as, for example, of a part of a human body that is to be investigated, where the body is lying on a couch 23 and is slid continually into the magnetic resonance unit 5. The high degree of homogeneity within the basic magnetic field that is required for the measurement of the nuclear magnetic resonance is defined in a typically spherical measurement volume M, through which the parts of the human body to be investigated are continually slid. In order to support the homogeneity requirements and in particular to eliminate chronologically invariable influences, "shim plates" of ferromagnetic material are used in an appropriate place. Chronologically variable influences are eliminated using shim coils 2.

In the basic field magnet 1, a cylindrical gradient field system or gradient field system 3 consisting of three sub-windings is used. Each sub-winding is supplied by an amplifier with current to generate a linear (also chronologically variable) gradient field in the respective direction of the Cartesian coordinate system. The first sub-winding of the gradient field systems 3 generates a gradient $G_x$ in the x-direction, the second sub-winding a gradient $G_y$ in the y-direction and the third sub-winding a gradient $G_z$ in the z-direction. Each amplifier encompasses a digital-analog converter, which is controlled by a sequence controller 18 to generate gradient pulses at the correct time.

Within the gradient field system 3, there is one (or more) radio frequency antennas 4, which convert the radio frequency pulses emitted by a radio frequency power amplifier into an alternating magnetic field to excite the nuclei and align the nuclear spins of the object O that is to be investigated or of the region of the object O that is to be investigated. Each radio frequency antenna 4 is formed by one or more RF transmission coils and one or more RF receiving coils in the form of an annular, preferably linear or matrix-shaped, arrangement of component coils. The RF-receiving coils of the respective radio frequency antenna 4 also convert the alternating magnetic field that emanates from the preceding nuclear spins, that is, usually, the nuclear spin echo signals excited by a pulse sequence composed of one or more radio frequency pulses and of one or more gradient pulses, into a voltage (test signal) that is supplied via an amplifier 7 to a radio frequency receiving channel 8 of a radio frequency system 22. The radio frequency system 22, which forms part of a control computer 10 of the magnetic resonance apparatus 5, further encompasses a transmission channel 9, in which the radio frequency pulses to excite the nuclear magnetic resonance are generated. The respective radio frequency pulses are represented in digital form as a sequence of complex numbers on the basis of a pulse sequence that is predetermined by a computational computer 20 in the sequence controller 18. This sequence of numbers is supplied as a real part and as an imaginary part via respective inputs 12 to a digital-analog converter in the radio frequency system 22, and from this to a transmission channel 9. In the transmission channel 9, the pulse sequences are modulated to a radio frequency carrier signal, the basic frequency of which corresponds to the resonance frequency of the nuclear spins in the measurement volume.

Switchover from transmitting to receiving mode is achieved via a duplexer 6. The RF transmission coils in the radio frequency antenna(s) 4 radiate the radio frequency pulses for exciting the nuclear spins into the measurement volume M and the resulting echo signals are sampled (detected) via the RF receiving coil(s). The nuclear magnetic resonance signals acquired accordingly are demodulated in the receiving channel 8' (first demodulator) in the radio frequency system 22 in a phase-sensitive manner to an intermediate frequency, are digitized in the analog-digital converter (ADC) and emitted via the output 11. This signal is further demodulated to the zero frequency. The demodulation to the zero frequency and the separation into the real and imaginary parts take place in the digital domain after digitalization in a second demodulator 8. An MR image is reconstructed by an image processor 17 from the measurement data thus acquired via an output 11. The management of the measurement data, of the image data and of the control programs ensues via the computational computer 20. Due to a specification with control programs, the sequence controller 18 controls the generation of the respective desired pulse sequences and the corresponding sampling of k-space. In particular, the sequence controller 18 controls the correctly-timed change of gradient, the transmission of the radio frequency pulses with a defined phase amplitude and likewise the reception of the nuclear magnetic resonance signals. The time base for the radio frequency system 22 and the sequence controller 18 is provided by a synthesizer 19. The selection of appropriate control programs for generating an MR image, which are stored on a DVD 21, for example, and likewise the depiction of the MR image that has been generated is achieved via a terminal 13 that encompasses a keyboard 15, a mouse 16 and a monitor 14.

Figure 2:
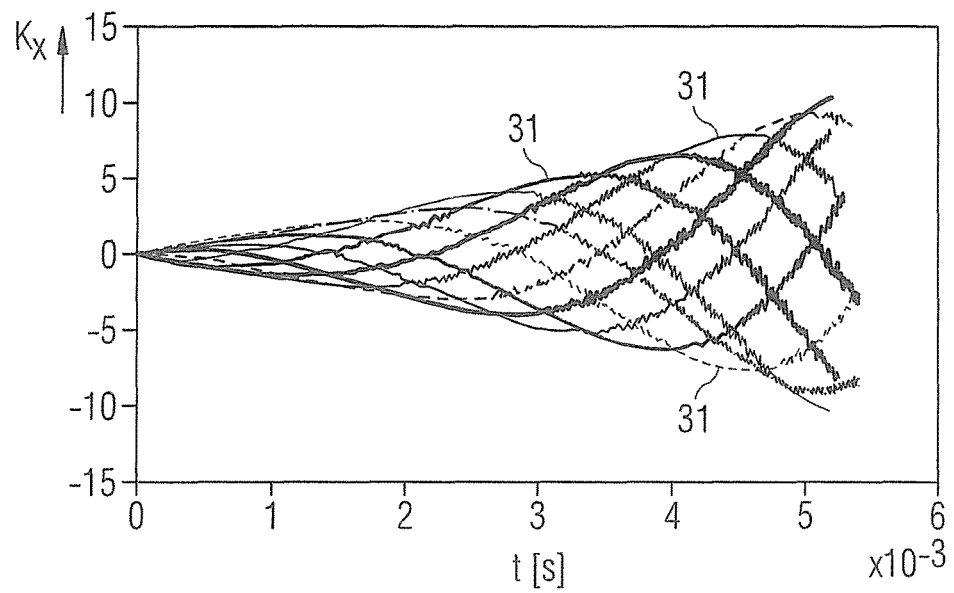
FIG. 2 shows the course of spiral trajectories according to the invention in the $k_x$-direction.

FIG. 2 shows the course of some spiral trajectories 31 according to the invention with respect to the k-space direction $k_x$ over time. Each of these spiral trajectories 31 has a pitch such that, after only one revolution, the respective trajectory already impinges on the edge of the k-space that is to be acquired.

In order to determine the k-space points to be sampled starting from these trajectories 31, a random element has only been used sparingly. Furthermore, each randomly determined k-space point is moved to the next FFT grid point. Due to the minimal role of randomness in the determination of the k-space points to be sampled, each k-space point to be sampled is only a slight distance from the ideal spiral trajectory (or from a spiral, from which the trajectory was developed).

Figure 3:
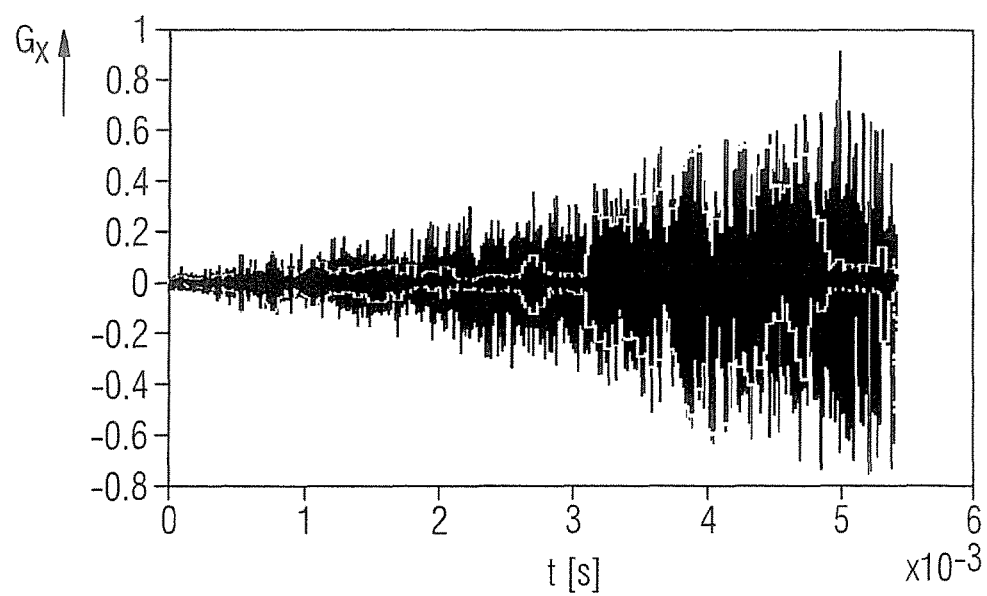
FIG. 3 shows a gradient course for implementing the course of the trajectories depicted in FIG. 2.

FIG. 3 shows the course over time of the magnetic field gradient $G_x$, with which course the trajectory course delineated in FIG. 2 can be achieved.

Figure 4:
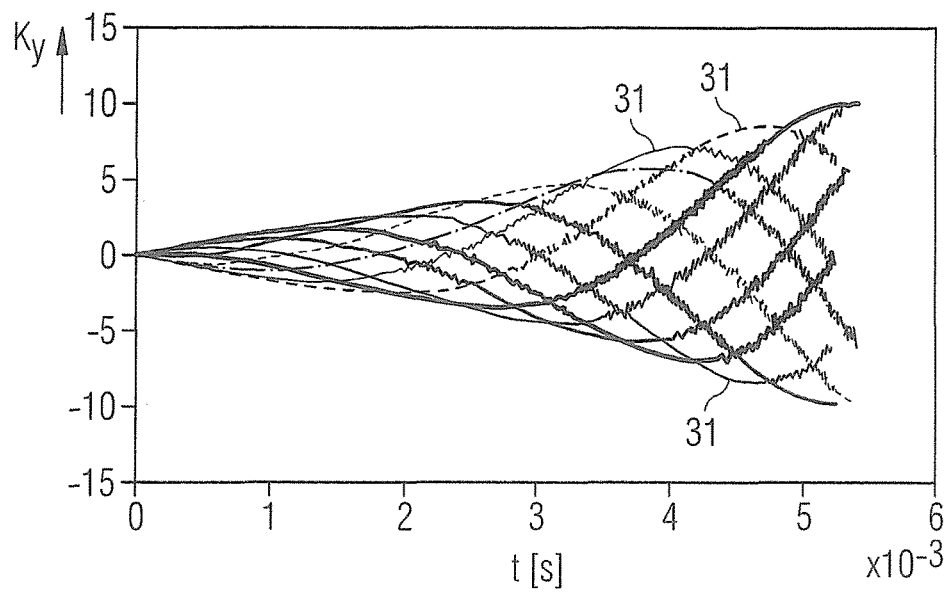
FIG. 4 shows the course of the trajectories depicted in FIG. 2 in the $k_y$ direction.

FIG. 4 shows the course over time of the trajectories 31 delineated in FIG. 2 with respect to the k-space direction $k_r$.

Figure 5:
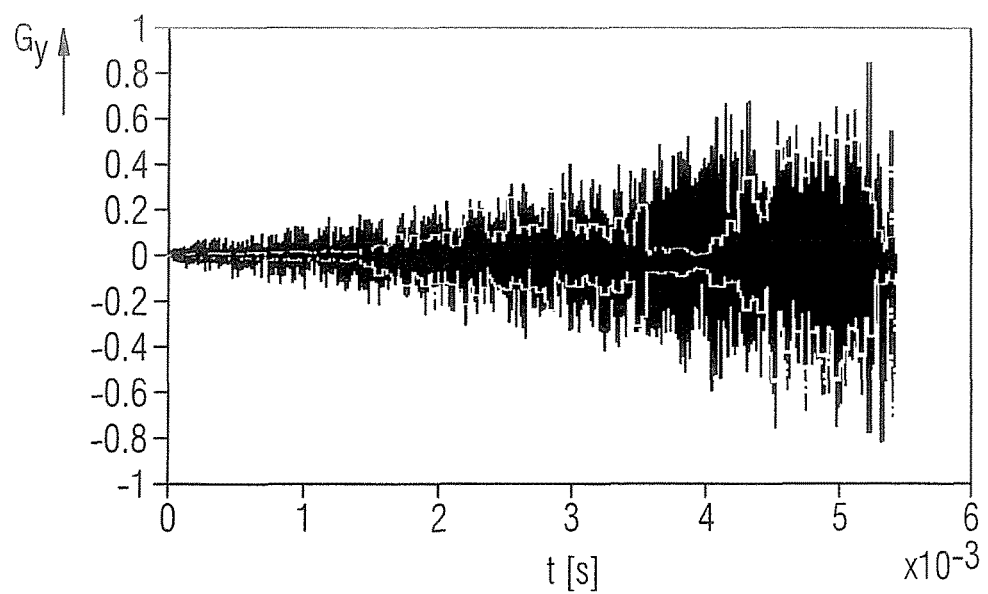
FIG. 5 shows a gradient course for implementing the course of the trajectories represented in FIG. 4.

FIG. 5 shows the course over time of the magnetic field gradient $G_y$, with which the trajectory course delineated in FIG. 4 can be achieved.

It should be pointed out that the same trajectories 31 are shown in FIGS. 2 and 4. To sample the k-space points on these trajectories 31, in each case both the magnetic field gradient $G_x$ and the magnetic field gradient $G_y$ must be applied, as shown in FIGS. 3 and 5.

Figure 6:
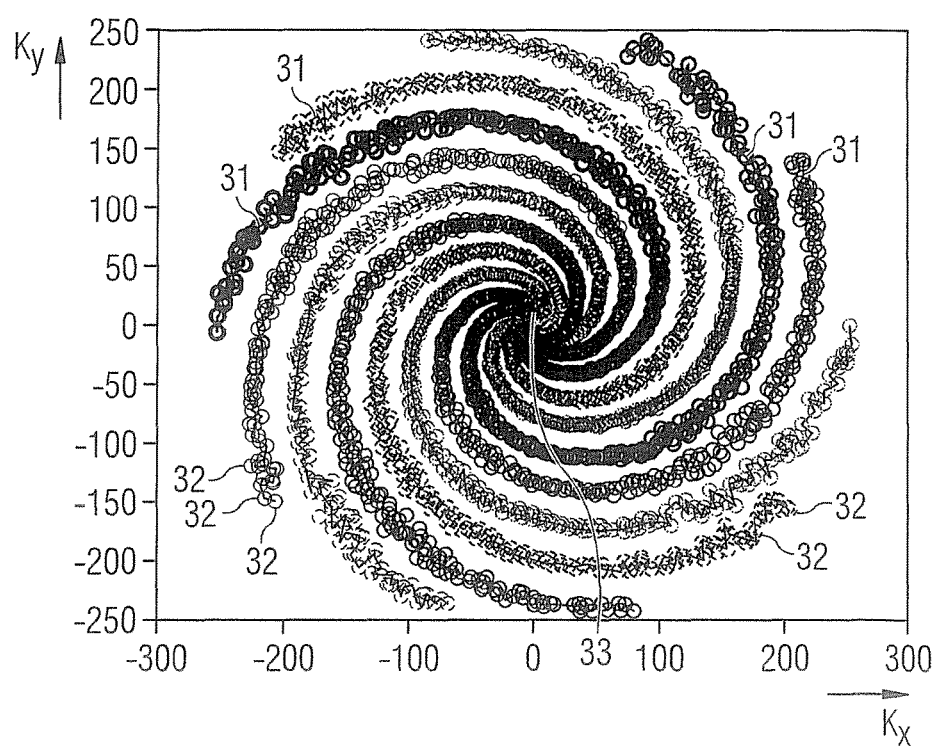
FIG. 6 shows the trajectories depicted in FIGS. 2 and 4 in a two-dimensional form.

FIG. 6 shows the trajectories 31 that are delineated in FIGS. 2 and 4 in two dimensions with respect to the $k_x$ and the $k_y$ directions. In FIG. 6, it can also be seen, from the short distance between the k-space points to be sampled 32 and the respective ideal course of the corresponding spiral trajectory 31, that the randomized moving of the respective k-space point to be sampled is only relatively slight.

Figure 7:
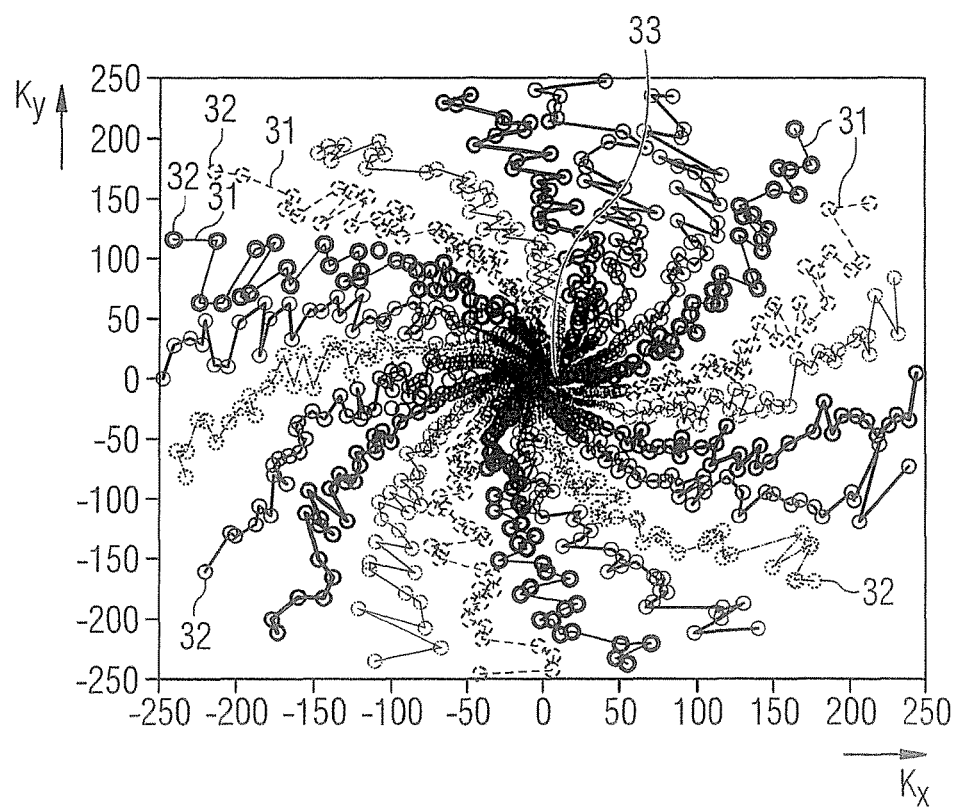
FIG. 7 shows k-space points determined according to the invention using k-space trajectories, wherein a random element is used more intensively than in the trajectories for FIG. 6.
Figure 8:
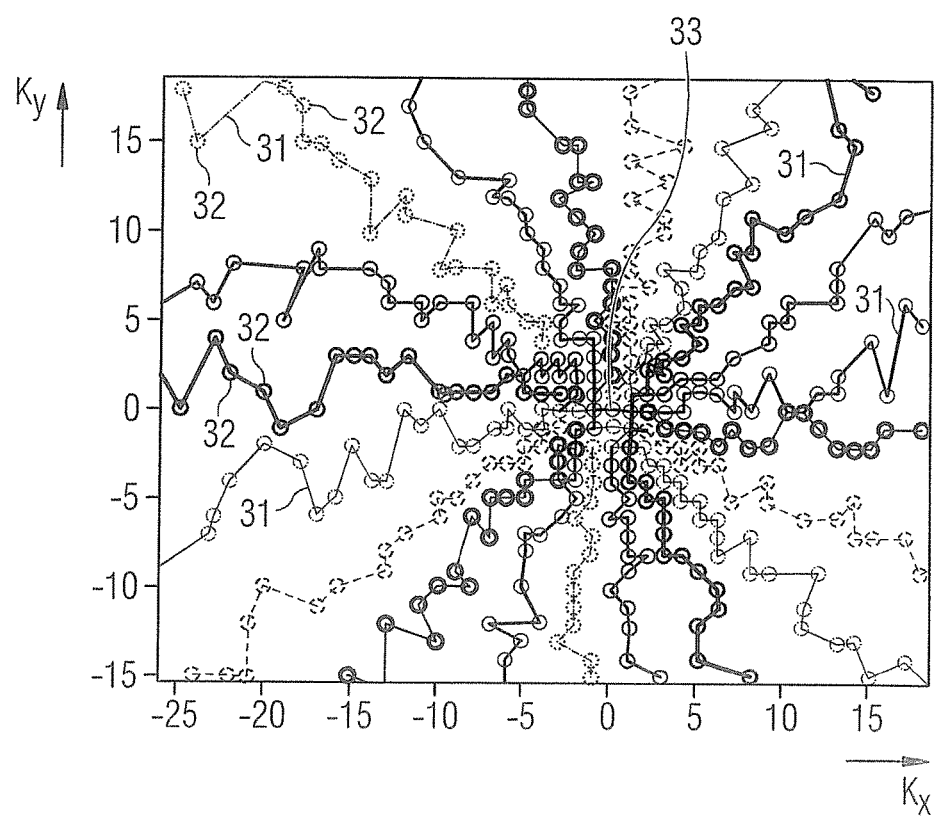
FIG. 8 shows in detail a region of the center of k-space in FIG. 7.

To determine the k-space points to be sampled 32 that are shown in FIGS. 7 and 8, a greater distribution of the random values was used than for the determination of the k-space points to be sampled 32 shown in FIGS. 2 to 6. Therefore, the trajectories 31 shown in FIGS. 7 and 8 also clearly deviate from an ideal spiral course.

While the entire two-dimensional k-space is shown in FIG. 7, FIG. 8 depicts only the region of k-space around the center of k-space 33.

FIG. 9 shows a flowchart for a method according to the invention.

In the first step S1, k-space points to be sampled are determined by means of spiral trajectories. Points that are located on an ideal spiral trajectory (spiral) are assigned a random value and as a result moved randomly. Each point moved corresponds to a k-space point to be sampled that was determined in step S1.

In the second step S2, the k-space points to be sampled that were determined in the first step S1 are moved onto FFT grid points.

In the third step S3, the k-space points to be sampled that were determined in the first two steps S1 and S2 are sampled by means of the acquisition of the MR data for these k-space points.

In the last step S4, an MR image is reconstructed as a function of the MR data acquired in step S3.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) data relating to a pre-determined two-dimensional volume segment within an examination object, comprising:

in a computer, for an MR data acquisition sequence in which MR signals acquired from the examination object are entered as numerical values into an electronic memory organized as k-space so as to thereby sample k-space, making a randomized determination of respective points to be sampled with said numerical values in k-space, that will cause k-space to be undersampled because only the determined points in k-space to-be-sampled are then sampled;

with said computer, operating a magnetic resonance data acquisition scanner so as to execute said data acquisition sequence, while the examination object is situated therein, in order to acquire said MR signals from the pre-determined two-dimensional volume segment within the examination object for the randomized determined points to be sampled, and entering said numerical values of said MR signals into said electronic memory organized as k-space at said randomized determined points, thereby resulting in said electronic memory comprising an undersampled set of k-space data;

in said computer executing a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and displaying said image of said two-dimensional volume segment, with said image content, reconstructed from said undersampled set of k-space data, at a display screen.

2. A method as claimed in claim 1 comprising, in said computer:
defining each of said points to be sampled in polar coordinates defined by an angle on an axis proceeding through a center of k-space and a distance from said center; and
using, as said randomized determination of said points to be sampled, a randomized determination based on a constant density of said points to be sampled as a function of said angle and a density of said points to be sampled that decreases with increasing distance from said center.

3. A method as claimed in claim 2 comprising, in said randomized determination of said points to be sampled, using radial or spiral trajectories in k-space that began at a center of k-space, and determining said points to be sampled with respect to said trajectories.

4. A method as claimed in claim 3 comprising:
in said computer, in said randomized determination of said points to be sampled, determining intermediate points on said trajectories, with each intermediate point in polar coordinates being defined by an angle with respect to said axis through said center of k-space, and a distance from said center; and
determining each point to be sampled starting from one of said intermediate points, with an angle of the respective intermediate point being assigned a random value.

5. A method as claimed in claim 1 comprising allowing a single point in k-space to be determined multiple times as a point to be sampled in said randomized determination.

6. A method as claimed in claim 1 comprising allowing a single point in k-space to be determined only once as a point to be sampled in said randomized determination.

7. A method as claimed in claim 1 comprising, in said computer:
determining a sequence in which said points to be sampled are sampled, with a distance between two of said points to be sampled that are adjacent to each other in said sequence being as small as possible.

8. A method as claimed in claim 1 comprising acquiring said MR data by operating said MR apparatus with a plurality of receiving antennas in a parallel acquisition technique.

9. A method as claimed in claim 1 comprising, in said computer:
moving each determined point to be sampled to a grid point on a pre-determined grid in k-space;
defining said grid in k-space by parallel first straight lines and parallel second straight lines, said first straight line being perpendicular to said second straight lines;
each two adjacent lines among said first straight lines having a distance therebetween and each two adjacent lines among said second straight lines also having said distance therebetween; and
each grid point in said pre-determined grid in k-space corresponding to a point of interception of one of said first straight lines with one of said second straight lines.

10. A method for acquiring magnetic resonance (MR) data relating to a pre-determined two-dimensional volume segment within an examination object, comprising:
in a computer, for an MR data acquisition sequence in which MR signals acquired from the examination object are entered as numerical values into an electronic memory organized as k-space so as to thereby sample k-space, making a determination of respective points to be sampled with said numerical values in k-space using radial or spiral trajectories in k-space that begin at a center of k-space, that will cause k-space to be undersampled because only the determined points in k-space are then sampled;
in said computer, defining gradient fields to be activated in said MR data acquisition sequence so as to move each determined point to be sampled to a grid point on a pre-determined grid in k-space;
in said computer, defining said gradient field so as to produce said grid in k-space by parallel first straight lines and parallel second straight lines, said first straight line being perpendicular to said second straight lines with each two adjacent lines among said first straight lines having a distance therebetween and each two adjacent lines among said second straight lines also having said distance therebetween, and with each grid point in said pre-determined grid in k-space corresponding to a point of interception of one of said first straight lines with one of said second straight lines;
from said computer, operating a magnetic resonance data acquisition scanner so as to execute said data acquisition sequence, while the examination object is situated therein, in order to acquire said MR signals from the pre-determined two-dimensional volume segment within the examination object for the randomized determined points to be sampled, and entering said numerical values of said MR signals into said electronic memory organized as k-space at said randomized determined points, thereby resulting in said electronic memory comprising an undersampled set of k-space data;
in said computer, executing a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and
displaying said image of said two-dimensional volume segment, with said image content, reconstructed from said undersampled set of k-space data, at a display screen.

11. A magnetic resonance apparatus comprising:
a magnetic resonance scanner;
an electronic memory organized as k-space;
a computer configured, for an MR data acquisition sequence in which MR signals acquired from the examination object are entered as numerical values into said electronic memory organized as k-space so as to thereby sample k-space, to make a randomized determination of respective points to be sampled in k-space, that will cause k-space to be undersampled because only the determined points in k-space are then sampled;
said computer being configured to operate the magnetic resonance scanner so as to execute said data acquisition sequence, while an examination object is situated therein, in order to acquire said MR signals from the pre-determined two-dimensional volume segment within the examination object for the randomized determined points to be sampled, and to enter said numerical values of said MR signals into the electronic memory organized as k-space at said randomized determined points, thereby resulting in said electronic memory comprising an undersampled set of k-space data;
said computer being configured to execute a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and
said computer being configured to display said image of said two-dimensional volume segment, with said image content, reconstructed from said undersampled set of k-space data, at a display screen.

12. A magnetic resonance apparatus comprising:
a magnetic resonance scanner;
an electronic memory organized as k-space;
a computer configured, for an MR data acquisition sequence in which MR signals acquired from the examination object are entered as numerical values into an electronic memory organized as k-space so as to thereby sample k-space, to make a determination of respective points to be sampled with said numerical values in k-space using radial or spiral trajectories in k-space that begin at a center of k-space, that will cause k-space to be undersampled because only the determined points in k-space are then sampled;
said computer being configured to define gradient fields to be activated in said MR data acquisition sequence so as to move each determined point to be sampled to a grid point on a pre-determined grid in k-space;
said computer being configured to define said gradient fields so as to produce said grid in k-space by parallel first straight lines and parallel second straight lines, said first straight line being perpendicular to said second straight lines, with each two adjacent lines among said first straight lines having a distance therebetween and each two adjacent lines among said second straight lines also having said distance therebetween and with each grid point in said pre-determined grid in k-space corresponding to a point of interception of one of said first straight lines with one of said second straight lines;
said computer being configured to operate the magnetic resonance scanner so as to execute said data acquisition sequence, while an examination object is situated therein, so as to acquire said MR signals from the pre-determined two-dimensional volume segment within the examination object for the randomized determined points to be sampled, and to enter said numerical values of said MR signals into the electronic memory organized as k-space at said randomized determined points, thereby resulting in said electronic memory comprising an undersampled set of k-space data;
said computer being configured to execute a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and
said computer being configured to display said image of said two-dimensional volume segment, with said image content, reconstructed from said undersampled set of k-space data, at a display screen.

13. A non-transitory, computer-readable data storage medium encoded with programming instructions, said storage medium being loaded into a computer system of a magnetic resonance apparatus, said programming instructions causing said computer system to:
make for an MR data acquisition sequence in which MR signals acquired from the examination object are entered as numerical values into an electronic memory organized as k-space so as to thereby sample k-space, a randomized determination of respective points to be sampled with said numerical values in k-space, that will cause k-space to be undersampled because only the determined points in k-space are then sampled;
operate a magnetic resonance data acquisition scanner so as to execute said data acquisition sequence, while the examination object is situated therein, to acquire said MR signals from the pre-determined two-dimensional volume segment within the examination object for the randomized determined points to be sampled, and enter said numerical value of said MR signals into said electronic memory organized as k-space at said determined points, thereby resulting in said electronic memory comprising an undersampled set of k-space data;
execute a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and
display said image of said two-dimensional volume segment, with said image content, reconstructed from said undersampled set of k-space data, at a display screen.

14. A non-transitory, computer-readable data storage medium encoded with programming instructions, said storage medium being loaded into a computer system of a magnetic resonance apparatus having a magnetic resonance data acquisition scanner, said programming instructions causing said computer system to:
make, for an MR data acquisition sequence in which MR signals acquired from the examination object are entered as numerical values into an electronic memory organized as k-space so as to thereby sample k-space, a determination of respective points to be sampled with said numerical values in k-space using radial or spiral trajectories in k-space that begin at a center of k-space, that will cause k-space to be undersampled because only the determined points in k-space are then sampled;

define gradient fields to be activated in said MR data acquisition sequence so as to move each determined point to be sampled to a grid point on a pre-determined grid in k-space, with said grid defined in k-space by parallel first straight lines and parallel second straight lines said first straight line being perpendicular to said second straight lines with each two adjacent lines among said first straight lines having a distance therebetween and each two adjacent lines among said second straight lines also having said distance therebetween, and with each grid point in said pre-determined grid in k-space corresponding to a point of interception of one of said first straight lines with one of said second straight lines;

operate the magnetic resonance data acquisition scanner so as to execute said data acquisition sequence, while the examination object is situated therein, in order to acquire said MR signals from the pre-determined two-dimensional volume segment within the examination object for the randomized determined points to be sampled, and enter said numerical values of said MR signals into said electronic memory organized as k-space at said randomized determined points, thereby resulting in said electronic memory comprising an undersampled set of k-space data;

in said computer, execute a reconstruction algorithm in order to generate image data from said undersampled set of k-space data that form an image of said two-dimensional volume segment that, due to said randomized determination of points sampled in k-space, has a same image content as an image reconstructed from a fully sampled set of k-space data for said two-dimensional volume segment; and said computer being configured to display said image of said two-dimensional volume segment, with said image content reconstructed from said undersampled set of k-space data, at a display screen.

* * * * *